United States Patent [19]
Matsushita

[11] Patent Number: 5,608,738
[45] Date of Patent: Mar. 4, 1997

[54] PACKET TRANSMISSION METHOD AND APPARATUS

[75] Inventor: Hideaki Matsushita, Tokyo, Japan

[73] Assignee: NEC Corporation, Tokyo, Japan

[21] Appl. No.: 338,778

[22] Filed: Nov. 10, 1994

[30] Foreign Application Priority Data

Nov. 10, 1993 [JP] Japan .................................. 5-303311

[51] Int. Cl.$^6$ .................................................. H03M 13/00
[52] U.S. Cl. ...................................... 371/37.1; 371/37.7
[58] Field of Search ................................ 371/37.1, 37.4, 371/37.5, 37.7, 38.1, 39.1; 370/60, 94.1

[56] References Cited

U.S. PATENT DOCUMENTS

| | | | |
|---|---|---|---|
| Re. 33,462 | 11/1990 | Suzuki et al. | 371/37.5 |
| 4,769,818 | 9/1988 | Mortimer | 371/37.4 |
| 4,769,819 | 9/1988 | Matsutani et al. | 371/37.4 |
| 5,159,452 | 10/1992 | Kinoshita | 371/38.1 |
| 5,365,530 | 11/1994 | Yoshida | 371/37.4 |
| 5,400,347 | 3/1995 | Lee | 371/37.4 |
| 5,430,738 | 7/1995 | Tsuda | 371/37.1 |
| 5,432,787 | 7/1995 | Chethik | 370/79 |

FOREIGN PATENT DOCUMENTS 2-159651  6/1990  Japan .

*Primary Examiner*—Roy N. Envall, Jr.
*Assistant Examiner*—Brian C. Oakes
*Attorney, Agent, or Firm*—Foley & Lardner

[57] ABSTRACT

In a packet transmission method of forming m error correction code packets from n (n>m) data packets including headers, and transmitting the error correction code packets, an n-bit data code portion is formed by reading out pieces of bit information, of the data packets excluding headers, which are located at the same bit position, and sequentially arranging the pieces of bit information. An m-bit error correction code portion is formed by coding information of the data code portion and forming an error correction frame constituted by the data code portion and the error correction code portion. Each bit information of the error correction code portion is assigned as bit information of a corresponding error correction code packet at the same bit position as the bit position of each data packet, from which the bit information is read out. Formation of the data code portion and the error correction frame is repeatedly performed with respect to all bits excluding the headers of the data packets, thereby forming m error correction code packets, each consisting of the same number of bits as that of each data packet. The formed error correction code packets are transmitted, together with the data packets. A packet transmission apparatus is also disclosed.

9 Claims, 3 Drawing Sheets

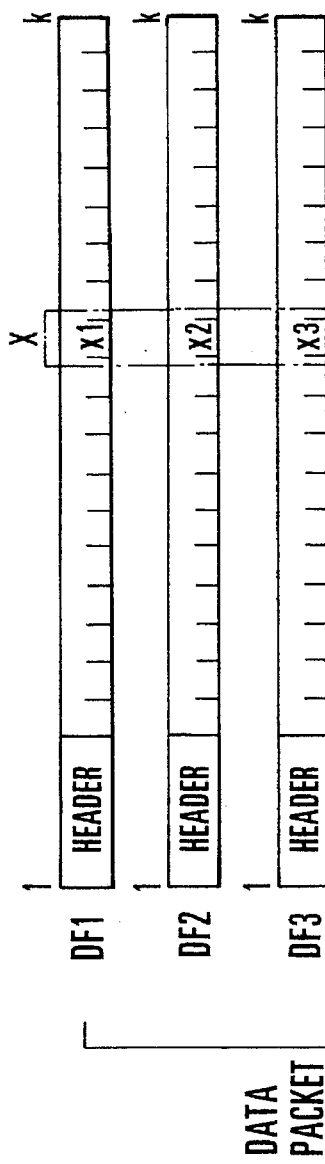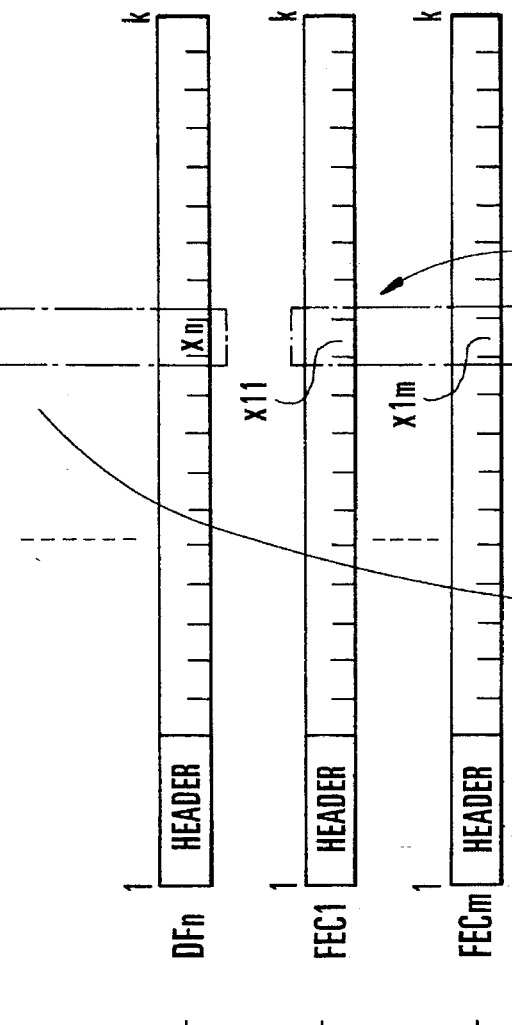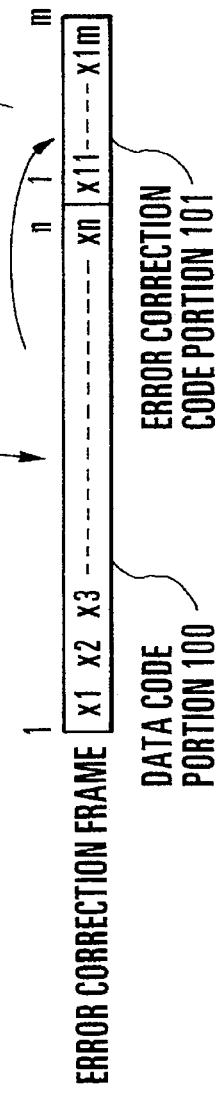
FIG.2A
FIG.2B
FIG.2C
FIG.2D
FIG.2E
FIG.2F
FIG.2G

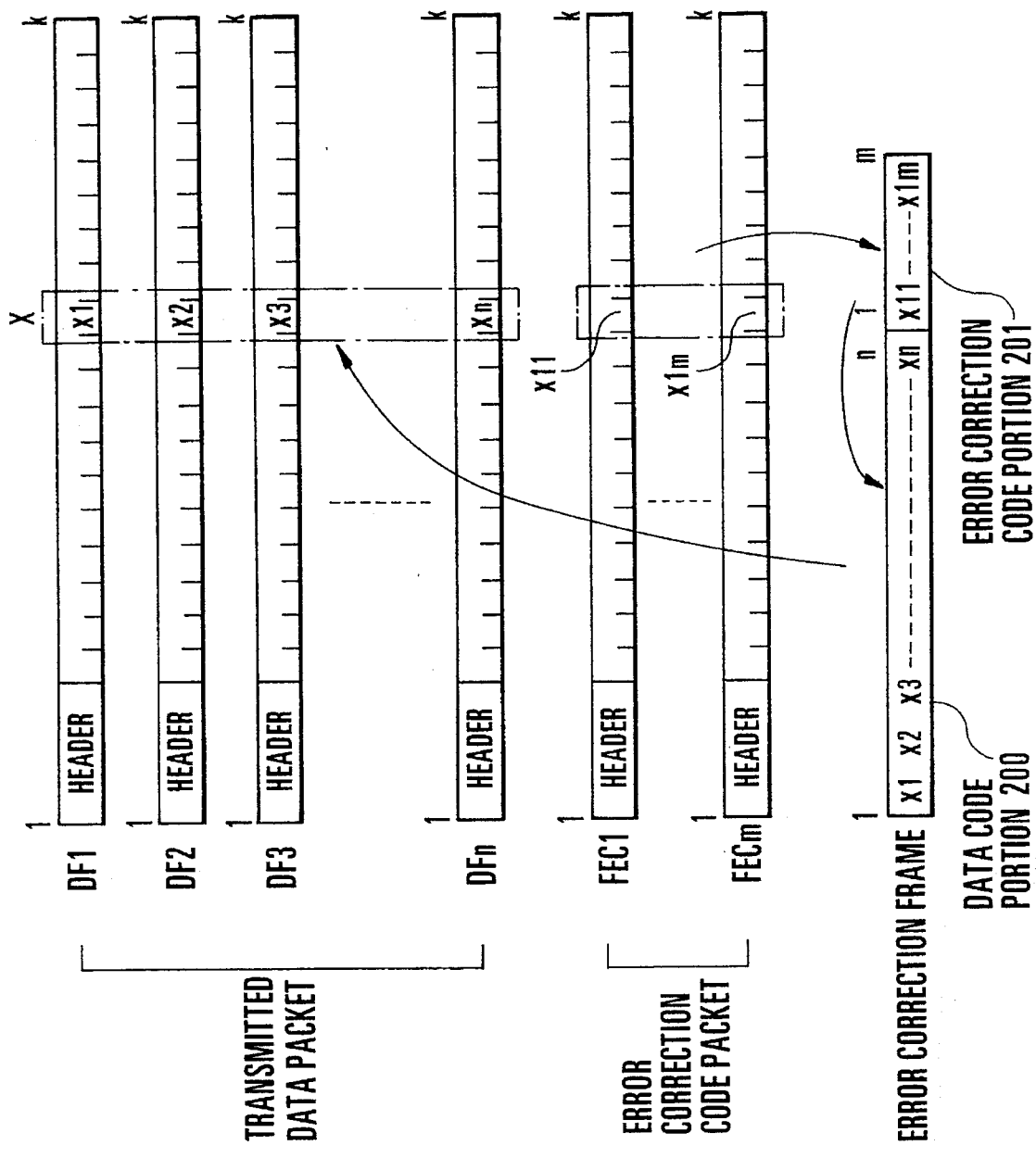

5,608,738

PACKET TRANSMISSION METHOD AND APPARATUS

BACKGROUND OF THE INVENTION

The present invention relates to a packet transmission method and apparatus which can cope with a data transmission packet loss or error.

In an error correction scheme for a conventional fixed-length packet switching system, error correction codes are added in units of packets at most. In many cases, error correction codes are not added to all the data of one packet, but an error correction code is added to a header portion which is an important portion of a packet. In many cases, data are processed in units of packets.

In the error correction scheme for this conventional fixed-length packet switching system, error correction codes are added to data in units of packets. Therefore, this scheme exhibits a correction ability with respect to bit errors in one packet but no effect on a packet loss. Especially in a fixed-length packet switching network such as an ATM (Asynchronous Transfer Mode) switching network, in which no error re-transmission processing is performed, a packet may be lost. For this reason, a communication device demanding high reliability in terms of transmission quality cannot be connected to such a network.

In a data memory monitoring scheme disclosed in Japanese Patent Laid-Open No. 2-159651, parity checks are performed in the vertical and horizontal directions of a plurality of data, thereby facilitating error detection processing. In such a monitoring scheme, a data loss can be detected at most, but no measures can be taken upon detection of a data loss.

SUMMARY OF THE INVENTION

It is an object of the present invention to provide a packet transmission method and apparatus which can perform effective error correction with respect to data errors in packets.

It is another object of the present invention to provide a packet transmission method and apparatus which can reproduce a lost packet.

In order to achieve the above objects, according to the present invention, there is provided a packet transmission method of forming m error correction code packets from n (n>m) data packets including headers, and transmitting the error correction code packets, comprising the steps of forming an n-bit data code portion by reading out pieces of bit information, of the data packets excluding headers, which are located at the same bit position, and sequentially arranging the pieces of bit information, forming an m-bit error correction code portion by coding information of the data code portion and forming an error correction frame constituted by the data code portion and the error correction code portion, assigning each bit information of the error correction code portion as bit information of a corresponding one of the error correction code packets at the same bit position as the bit position of each data packet, from which the bit information is read out, repeatedly performing formation of the data code portion and the error correction frame with respect to all bits excluding the headers of the data packets, thereby forming the error correction code packets, each consisting of the same number of bits as that of each data packet, and transmitting the formed error correction code packets together with the data packets.

BRIEF DESCRIPTION OF THE DRAWINGS

FIGS. 2A, 2B, 2C, 2D, 2E, 2F and 2G are charts showing the relationship between data pacets, error correction code packets, and an error correction frame so as to explain the operation of a transmitting section in FIG. 1; and FIGS. 3A, 3B, 3C, 3D, 3E, 3F and 3G are charts showing the relationship between transmitted data packets, error correction code pacets, and an error correction frame so as to explain the operation of a receiving section in FIG. 1.

DESCRIPTION OF THE PREFERRED EMBODIMENT

Figure 1:
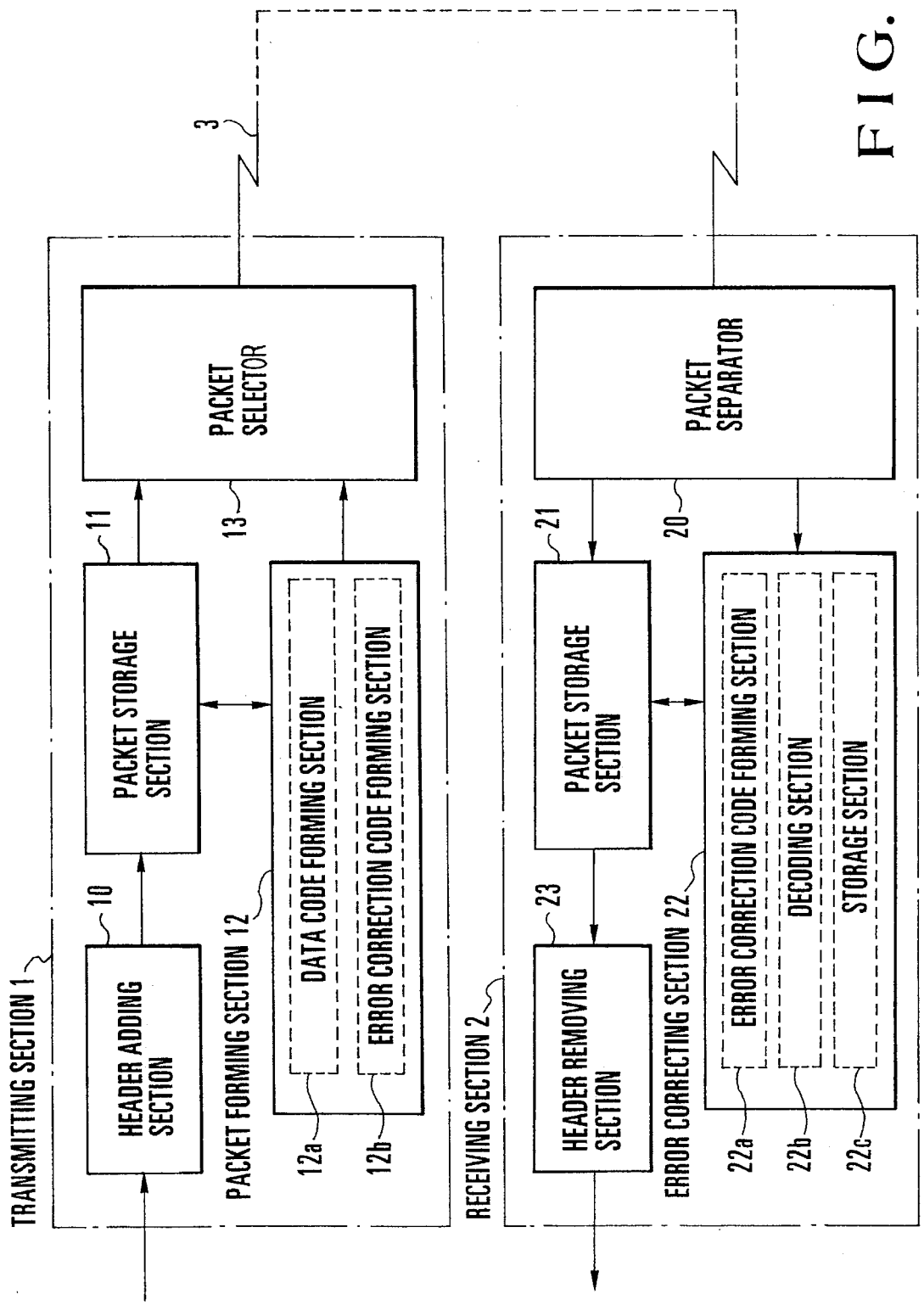
FIG. 1 is a block diagram showing a packet transmission apparatus according to an embodiment of the present invention.

FIG. 1 shows a packet transmission system according to an embodiment of the present invention. Referring to FIG. 1, a transmitting section 1 comprises a header adding section 10, a packet storage section 11, a packet forming section 12, and a packet selector 13. The header adding section 10 adds a header portion to the head portion of an input fixed-length packet. The packet storage section 11 sequentially stores a plurality of data packets output from the header adding section 10. The packet forming section 12 forms error correction code packets by using data portions obtained by removing headers from a plurality of data packets stored in the packet storage section 11. The packet selector 13 selects and sequentially outputs data packets read out from the packet storage section 11 and correction code packets formed by the packet forming section 12. The packet forming section 12 is constituted by a data code forming section 12a and an error correction code forming section 12b. The data code forming section 12a forms a data code portion 100 of an error correction frame (see FIG. 2G) by extracting bits of a plurality of data packets stored in the packet storage section 11 in the vertical direction, i.e., bit portions of adjacent data packets at the same bit position. The error correction code forming section 12b forms an error correction code portion 101 by performing error correction code calculation with respect to the data code portion 100. An error correction code packet is formed on the basis of the error correction code portion 101 formed by the error correction code forming section 12b.

A receiving section 2 comprises a packet separator 20, a packet storage section 21, an error correcting section 22, and a header removing section 23. The packet separator 20 separates a packet received via the transmission line 3 into a data packet and an error correction code packet. The packet storage section 21 sequentially stores a plurality of data packets from the packet separator 20. The error correcting section 22 performs error correction including reproduction with respect to the data packets stored in the packet storage section 21. The header removing section 23 removes header portions from data packets supplied from the packet storage section 21. The error correcting section 22 is constituted by a storage section 22c, an error correction frame forming section 22a, and a decoding section 22b. The storage section 22c stores error correction code packets from the packet separator 20. The error correction frame forming section 22a forms an error correction frame (see FIG. 3G) constituted by a data code portion 200 and an error correction code portion 201 from data packets stored in the packet storage section 21 and error correction code packets stored in the storage section 22c. The decoding section 22b decodes the data code portion 200 on the basis of the information of the error correction code portion 201 of the error correction frame formed by the error correction frame forming section 22a. The error correcting section 22 performs error correction of each data packet stored in the packet storage section 21 on the basis of the information of the data code portion 200 decoded by the decoding section 22b.

The operation of this embodiment will be described next with reference to FIGS. 2A to 2G. First of all, n data packets DF1 to DFn shown in FIGS. 2A to 2D, to which header portions are respectively added by the header adding section 10, are temporarily stored in the packet storage section 11 and transmitted to the receiving section 2. At this time, the data code forming section 12a extracts pieces of information "x1, x2, x3, ..., xn" of the Xth bits of the data portions of the data packets DF1 to DFn (excluding the headers) stored in the packet storage section 11, and arranges them in a line, i.e., in a data string, thereby forming the data code portion 100 shown in FIG. 2G. The error correction code forming section 12b then forms the error correction code portion 101 (shown in FIG. 2G) having m pieces of information, i.e., "x11, ..., x1m" on the basis of n (n>m) pieces of information of the data code portion 100. An error correction frame is formed from the data code portion 100 and the error correction code portion 101. When the error correction code portion 101 is to be formed from the information of the data code portion 100, the number m of pieces of information of the error correction code portion 101 is determined in consideration of conditions such as line quality according to a code theory to be described later.

The m pieces of information "x11, ..., x1m" of the error correction code portion 101 formed in this manner are extracted one by one to be respectively assigned to the Xth bits of m error correction code packets FEC1 to FECm (interleave processing), as shown in FIGS. 2E and 2F. That is, the m extracted pieces of information are respectively set in the error correction code packets FEC1 to FECm at the same bit position as the bit position of each data packet, from which bit information is read.

These processes are sequentially performed with respect to the data packets DF1 to DFn for each of all the bits excluding the header portions, thereby forming the error correction code packets FEC1 to FECm, each consisting of k bits equal in number to the bits of each of the data packets DF1 to DFn. The error correction code packets EFC1 to FECm formed in this manner are selected by the packet selector 13 and sequentially output to the transmission line 3, together with the data packets DF1 to DFn.

Upon reception of such packet information via the transmission line 3, the receiving section 2 performs data reproduction in accordance with the procedure shown in FIGS. 3A to 3G. More specifically, the packet separator 20 separates the received packet information into the data packets shown in FIGS. 3A to 3D and the error correction code packets shown in FIGS. 3E and 3F. The separated data packets are stored in the packet storage section 21. The error correction code packets are stored in the storage section 22c of the error correcting section 22. As shown in FIG. 3G, the error correction frame forming section 22a of the error correcting section 22 arranges n pieces of information of the Xth bits of the data packets DF1 to DFn, stored in the packet storage section 21, in a line, thereby forming the data code portion 200 of an error correction frame, which consists of "x1, x2, x3, ..., xn". At the same time, the error correction frame forming section 22a arranges m pieces of information of the error correction code packets FEC1 to FECm, stored in the storage section 22c, in a line, thereby forming the error correction code portion 20 of the error correction frame, which consists of "x11, ..., x1m". That is, the error correction frame forming section 22a forms an error correction frame constituted by the data code portion 200 and the error correction code portion 201.

Assume that a data packet is lost during transmission of data from the transmitting section 1 to the receiving section 2, or a data error is caused by a transmission line. In this case, correct bit information is lost from a portion, of the data code portion 200 of the error correction frame formed by the error correction frame forming section 22a, which corresponds to a data packet loss or a data error. If, for example, the data packet DF3 in FIG. 3C is lost, the bit information "x3" of the data code portion 200 changes, and correct bit information is lost. However, the information of the error correction code portion 201 of the error correction frame is the one formed in the transmitting section 1 on the basis on the information of the data code portion 200 of the error correction frame. This means that the data code portion 200 can be reproduced from the information of the error correction code portion 201 of the error correction frame formed by the receiving section 2. Therefore, in the receiving section 2, the data code decoding section 22b of the error correcting section 22 obtains a data code corresponding to the omitted portion by decoding on the basis of the error correction code portion 201 formed by the error correction frame forming section 22a.

When the data code portion 200 of the error correction frame is obtained in this manner, the error correcting section 22 transfers information constituted by the reproduced data code to a portion corresponding to the Xth bit of the lost data packet DF3 as indicated by an arrow in FIGS. 3A to 3G, thereby reproducing the data packet DF3 in the packet storage section 21. Even if all the information of the transmitted data packet DF3 is lost, the error correcting section 22 can completely reproduce the lost data packet DF3 by sequentially performing similar processing with respect to all the bits of the error correction code packets FEC1 to FECm.

In the above example, all the information of a transmitted data packet is lost. Even if, however, it is determined that a data error is present in a received data packet, the data packet having the data error can be correctly reproduced by the same method as described above.

A method of forming an error correction frame will be described next. The error correction frame shown in FIG. 2G is formed by appending the error correction code portion 101 to the data code portion 100. The error correction code portion 101 constituting the error correction frame is formed by operating the information of the data code portion 100 using a predetermined generating polynomial. The error correction frame shown in FIG. 3G is reproduced by the following method. The received error correction frame is divided by a predetermined generating polynomial. If the remainder is zero, it can be determined that no transmission error has occurred. Therefore, the original data can be reproduced by removing an error correction code from the received code.

As an error correction code, a known code such as a Reed-Solomon code is available. A generating polynomial can be determined by a code length and an error-correctable bit length. The operation principle of this polynomial will be described below. An error correction code R(x) is obtained as follows.

Assume that a data code p(x) is represented by a polynomial of degree (m−1). In this case, if the error correction frame length is n, "$n^{n-m}p(x)$" is divided by a generating polynomial G(x) to obtain a quotient Q(x) and a remainder R(x), thereby establishing equation (1) below:

$$x^{n-m}p(x)=Q(x)G(x)+R(x) \quad (1)$$

If the remainder R(x) is added to the left- and right-hand sides of equation (1) above, the following equation (2) is obtained:

$$F(x)=x^{n-m}p(x)+R(x)=Q(x)G(x) \quad (2)$$

R(x)+R(x)=0 (according to the definition of addition in module-2)

The remainder R(x) is an error correction code.

In equation (2) above, F(x) represents an error correction frame to be transmitted, and $x^{n-m}$ is only subjected to bit shift. Therefore, an error correction frame is constituted by a data code and an error correction code.

If a received code is represented by H(x), and no error is caused during transmission of the code, equation (3) given below can be established:

$$H(x)=F(x)=Q(x)G(x) \quad (3)$$

Therefore, when the received code represented by equation (3) above is divided by G(x), the remainder is zero.

If, however, an error is present, the following result is obtained.

If the ith digit has an error, the error can be expressed as $x_i$. Therefore, a received code having an error can be expressed by equation (4):

$$H(x)=F(x)=Q(x)G(x)+x^i \quad (4)$$

Equation (4) is divided by the generating polynomial G(x) to obtain a quotient and a remainder. A specific digit where the error is present can be determined from the remainder.

As described above, if the remainder after division of a received code by the generating polynomial G(x) is zero, it can be determined that no error has occurred. Otherwise, it can be determined that an error has occurred, and a specific bit where the error has occurred can be identified from the value of the remainder. Therefore, the error bit can be corrected on the basis of the error correction code of the error correction frame.

Assume that n=7, m=4, and $G(x)=x^3+x+1$. In this case, $$p(x)=d_3x^3+d_2x^2+d_1x+d_0$$

$$F(x)=d_3x^6+d_2x^5+d_1x^4+d_0x^3+C_2x^2+C_1x+C_0$$

If p(x)=1010($d_3$, $d_2$, $d_1$, $d_0$), error correction code R(x)=011($C_2$, $C_1$, $C_0$)

error correction frame F(x)=1010011($d_3$, $d_2$, $d_1$, $C_2$, $C_1$, $C_0$)

Assume that an error has occurred on a transmission line, and bit "$d_3$" of a received signal has erroneously changed from "1" to "0". In this case, a received error correction frame is H(x)=Fe(x)0010011. When this value is divided by the generating polynomial G(x), the remainder is Re(x)=101. Since Re(X) is not zero, it is determined that there is an error in the received code. It is also determined from the value of the remainder that bit "$d_3$" is the error bit. Therefore, error correction can be performed.

As has been described above, according to the present invention, error correction code packets are generated with respect to data packets, and data, of the data packets and the error correction code packets excluding headers, which are located at the same bit position are read out. The read data are sequentially arranged to form an error correction frame. Such error correction frames are formed with respect to all the bits. Therefore, a lost packet can be easily reproduced from the information of a corresponding error correction frame.

What is claimed is:

1. A packet transmission error correction method which uses m error correction code packets formed from n (n>m) data packets including headers, said method comprising the steps of:

(a) forming an n-bit data code portion by reading out from each of the data packets bit information at a bit position x and sequentially arranging the bit information;

(b) forming an m-bit error correction code portion by coding the sequentially arranged bit information of the data code portion and forming an error correction frame constituted by the data code portion and the error correction code portion;

(c) assigning each bit information of the error correction code portion as bit information of a corresponding one of the error correction code packets at the bit position x;

(d) repeatedly performing steps (a) to (c) with respect to all bits of the data packets excluding the headers, thereby forming m error correction code packets;

(e) transmitting the formed error correction code packets together with the data packets;

(f) receiving the formed error correction code packets together with the data packets;

(g) reconstructing the data code portions of the error correction frames by performing step (a) with respect to all bits of the received data packet;

(h) reconstructing the error correction code portions of the error correction frames by
   (1) reading out from each of the error correction code packets bit information at a bit position y and sequentially arranging the bit information, and
   (2) repeatedly performing sub-step (1) with respect to all bits of the error correction code packets excluding header bits;

(i) when there is a data loss or a data error in a data packet, decoding the data code portion of the error correction frame on the basis of bit information contained in the corresponding error correction code portion; and (j) reproducing the data packet in which the data loss or the data error has occurred on the basis of bit information contained in the decoded data code portion.

2. A method according to claim 1, further comprising the step of temporarily storing the data packets before the packets are transmitted, wherein the data code portion is formed from information of the stored data packets.

3. A method according to claim 1, further comprising the step of repeatedly performing formation of the error correction frame and decoding of the information of the data code portion with respect to all bits of the data packets and the error correction code packets excluding headers, wherein information of the data packet excluding the header is reproduced from information of the repeatedly decoded data code portion.

4. A method according to claim 1, further comprising the steps of separating received packets into the data packets and the error correction code packets, and sequentially storing the separated data packets, wherein the error correction frame is formed from the stored data packets.

5. A packet transmission error correction apparatus which uses m error correction code packets formed from n (n>m) data packets including headers, said apparatus comprising:

data code forming means for forming an n-bit data code portion by reading out from each of the data packets bit information at a bit position x and sequentially arranging the bit information, said data code forming means sequentially shifting a read bit position and repeatedly forming a data code portion corresponding each bit position of the data packets excluding the header;

error correction code forming means for repeatedly forming an m-bit error correction code portion by coding the bit information of each data code portion formed from said data code forming means, and forming an error correction frame constituted by a data code portion and an error correction code portion for each bit position of the data packets excluding the header;

interleave processing means for repeatedly assigning each bit information of the error correction code portion as bit information of a corresponding one of the error correction code packets at a bit position corresponding to the read bit position for each error correction frame formed from said error correction code forming means, and thereby forming the m error correction code packets;

transmitting means for transmitting the formed error correction packets, together with the data packets;

receiving means for receiving the formed error correction code packets together with the data packets;

error correction frame reconstruction means for reconstructing, for each bit position of the received data packets excluding the header, the data code portion of the error correction frame by reading out bit information of received data packets at said each bit position and sequentially arranging the read out bit information, and for reconstructing, for each bit position of the received error correction code packets excluding header bits, the error correction code portion of the error correction frame by reading out bit information of received error correction code packets at said each bit position and sequentially arranging the read out bit information;

data code decoding means for decoding bit information contained in the data code portion on the basis of bit information contained in the corresponding error correction code portion when there is a data loss or a data error in a data packet during transmission; and error correcting means for reproducing the data packet in which the data loss or the data error has occurred on the basis of bit information contained in the data code portion decoded by said data code decoding means.

6. An apparatus according to claim 5, further comprising first packet storage means for temporarily storing the data packets before the packets are transmitted, wherein said data code forming means forms the data code portion from information of the stored data packets stored in said first storage means.

7. An apparatus according to claim 5, wherein said error correction frame forming means and said data code decoding means repeatedly perform formation of the error correction frame and decoding of the information of the data code portion with respect to all bits of the data packets and the error correction code packets excluding headers, and said error correction means reproduces a lost data packet by reproducing all information of the data packet excluding a header on the basis of information of data code portions decoded by said data code decoding means.

8. An apparatus according to claim 5, further comprising separating means for separating received packets into the data packets and the error correction code packets, and second storage means for sequentially storing the separated data packets, wherein said error correction frame forming means forms an error correction frame from the data packets stored in said second storage means.

9. A packet transmission error correction apparatus which uses m error correction code packets formed from n (n>m) data packets including headers, said apparatus comprising:

data code forming means for forming an n-bit data code portion by reading out from each of the data packets bit information at a bit position x and sequentially arranging the bit information, said data code forming means sequentially shifting a read bit position and repeatedly forming a data code portion corresponding each bit position of the data packets excluding the header;

error correction code forming means for repeatedly forming an m-bit error correction code portion by coding the bit information of each data code portion formed from said data code forming means, and forming an error correction frame constituted by a data code portion and an error correction code portion for each bit position of the data packets excluding the header;

interleave processing means for repeatedly assigning each bit information of the error correction code portion as bit information of a corresponding one of the error correction code packets at a bit position corresponding to the read bit position for each error correction frame formed from said error correction code forming means, and thereby forming the m error correction code packets;

transmitting means for transmitting the formed error correction packets, together with the data packets;

receiving means for receiving the formed error correction code packets together with the data packets;

error correction frame reconstruction means for reconstructing, for each bit position of the received data packets excluding the header, the data code portion of the error correction frame by reading out bit information of received data packets at said each bit position and sequentially arranging the read out bit information, and for reconstructing, for each bit position of the received error correction code packets excluding header bits, the error correction code portion of the error correction frame by reading out bit information of received error correction code packets at said each bit position and sequentially arranging the read out bit information;

data code decoding means for decoding bit information contained in the data code portion on the basis of bit information contained in the corresponding error correction code portion when there is a data loss or a data error in a data packet during transmission;

first packet storage means for temporarily storing the data packets before the packets are transmitted, wherein said data code forming means forms the data code portion from bit information contained in the data packets stored in said first storage means;

separating means for separating the received packets into the data packets and the error correction code packets; and second packet storage means for sequentially storing the separated data packets, wherein said error correction frame forming means forms the error correction frame from the data packets stored in said second packet storage means.

* * * * *